United States Patent
Edelstein et al.

(10) Patent No.: US 11,177,167 B2
(45) Date of Patent: *Nov. 16, 2021

(54) ULTRATHIN MULTILAYER METAL ALLOY LINER FOR NANO CU INTERCONNECTS

(71) Applicant: International Business Machines Corporation, Armonk, NY (US)

(72) Inventors: Daniel Edelstein, Armonk, NY (US); Alfred Grill, Armonk, NY (US); Seth L. Knupp, Armonk, NY (US); Son Nguyen, Armonk, NY (US); Takeshi Nogami, Armonk, NY (US); Vamsi K. Paruchuri, Armonk, NY (US); Hosadurga K. Shobha, Armonk, NY (US); Chih-Chao Yang, Armonk, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/150,961

(22) Filed: May 10, 2016

(65) Prior Publication Data
US 2016/0268160 A1 Sep. 15, 2016

Related U.S. Application Data

(62) Division of application No. 14/298,938, filed on Jun. 8, 2014.

(51) Int. Cl.
*H01L 21/768* (2006.01)
*H01L 23/532* (2006.01)
(Continued)

(52) U.S. Cl.
CPC ........ *H01L 21/76843* (2013.01); *C23C 16/04* (2013.01); *C23C 16/06* (2013.01);
(Continued)

(58) Field of Classification Search
CPC ....... H01L 21/76849–76852; H01L 23/53238; H01L 2221/1073; H01L 21/76843
See application file for complete search history.

(56) References Cited

U.S. PATENT DOCUMENTS

| 7,008,872 | B2 | 5/2006 | Dubin et al. |
| 7,211,505 | B2 | 5/2007 | Abe |

(Continued)

FOREIGN PATENT DOCUMENTS

| CN | 103000570 A | * | 3/2013 |
| JP | 2013194247 A | * | 9/2013 |

OTHER PUBLICATIONS

Daniel Edelstein et al., Unpublished U.S. Appl. No. 16/399,955, filed Apr. 30, 2019, pp. 1-37 Plus 9 Sheets Drawings.

(Continued)

*Primary Examiner* — Alia Sabur
(74) *Attorney, Agent, or Firm* — Daniel Morris; Otterstedt, Wallace & Kammer, LLP

(57) ABSTRACT

Compositions of matter, compounds, articles of manufacture and processes to reduce or substantially eliminate EM and/or stress migration, and/or TDDB in copper interconnects in microelectronic devices and circuits, especially a metal liner around copper interconnects comprise an ultra thin layer or layers of Mn alloys containing at least one of W and/or Co on the metal liner. This novel alloy provides EM and/or stress migration resistance, and/or TDDB resistance in these copper interconnects, comparable to thicker layers of other alloys found in substantially larger circuits and allows the miniaturization of the circuit without having to use thicker EM and/or TDDB resistant alloys previously used thereby enhancing the miniaturization, i.e., these novel alloy layers can be miniaturized along with the circuit and provide substantially the same EM and/or TDDB resistance as (Continued)

thicker layers of different alloy materials previously used that lose some of their EM and/or TDDB resistance when used as thinner layers.

16 Claims, 9 Drawing Sheets

(51) Int. Cl.

| | | |
|---|---|---|
| H01L 21/285 | (2006.01) | |
| C23C 16/18 | (2006.01) | |
| C23C 16/16 | (2006.01) | |
| C23C 16/06 | (2006.01) | |
| C23C 16/30 | (2006.01) | |
| C23C 16/56 | (2006.01) | |
| H01L 23/522 | (2006.01) | |
| H01L 23/528 | (2006.01) | |
| C23C 16/455 | (2006.01) | |
| C23C 16/54 | (2006.01) | |
| C23C 16/04 | (2006.01) | |
| C23C 16/505 | (2006.01) | |

(52) U.S. Cl.
CPC .............. *C23C 16/16* (2013.01); *C23C 16/18* (2013.01); *C23C 16/30* (2013.01); *C23C 16/45525* (2013.01); *C23C 16/45544* (2013.01); *C23C 16/505* (2013.01); *C23C 16/54* (2013.01); *C23C 16/56* (2013.01); *H01L 21/28556* (2013.01); *H01L 21/28562* (2013.01); *H01L 21/28568* (2013.01); *H01L 21/7684* (2013.01); *H01L 21/7685* (2013.01); *H01L 21/76802* (2013.01); *H01L 21/76831* (2013.01); *H01L 21/76834* (2013.01); *H01L 21/76846* (2013.01); *H01L 21/76849* (2013.01); *H01L 21/76852* (2013.01); *H01L 21/76862* (2013.01); *H01L 21/76864* (2013.01); *H01L 21/76879* (2013.01); *H01L 21/76883* (2013.01); *H01L 23/528* (2013.01); *H01L 23/5226* (2013.01); *H01L 23/53238* (2013.01); *H01L 2924/0002* (2013.01)

(56) References Cited

U.S. PATENT DOCUMENTS

| | | | |
|---|---|---|---|
| 7,393,781 B2 | 7/2008 | Yakobson et al. | |
| 7,749,892 B2 | 7/2010 | Bonilla et al. | |
| 7,776,743 B2 | 8/2010 | Russel et al. | |
| 7,871,929 B2 | 1/2011 | Russel et al. | |
| 7,977,239 B2 | 7/2011 | Iwasaki | |
| 7,998,864 B2 | 8/2011 | Yang et al. | |
| 8,129,269 B1 | 3/2012 | Bao et al. | |
| 8,242,019 B2 | 8/2012 | Ishizaka et al. | |
| 10,643,890 B2* | 5/2020 | Edelstein | H01L 21/28556 |
| 2008/0202892 A1 | 8/2008 | Smith et al. | |
| 2009/0302475 A1 | 12/2009 | Korogi et al. | |
| 2010/0301495 A1* | 12/2010 | Chikaki | H01L 21/7682 257/774 |
| 2011/0049716 A1* | 3/2011 | Yang | C23C 16/0272 257/751 |
| 2011/0108990 A1 | 5/2011 | Bonilla et al. | |
| 2011/0175226 A1 | 7/2011 | Bonilla et al. | |
| 2015/0004316 A1* | 1/2015 | Thompson | C23C 16/45553 427/253 |
| 2015/0045277 A1 | 2/2015 | Liu et al. | |
| 2015/0357236 A1 | 12/2015 | Edelstein et al. | |
| 2016/0268160 A1 | 9/2016 | Edelstein et al. | |
| 2016/0276216 A1 | 9/2016 | Edelstein et al. | |

OTHER PUBLICATIONS

Paul J. Otterstedt, List of IBM Patents or Patent Applications Treated as Related pp. 1-2, Feb. 3, 2021.

* cited by examiner

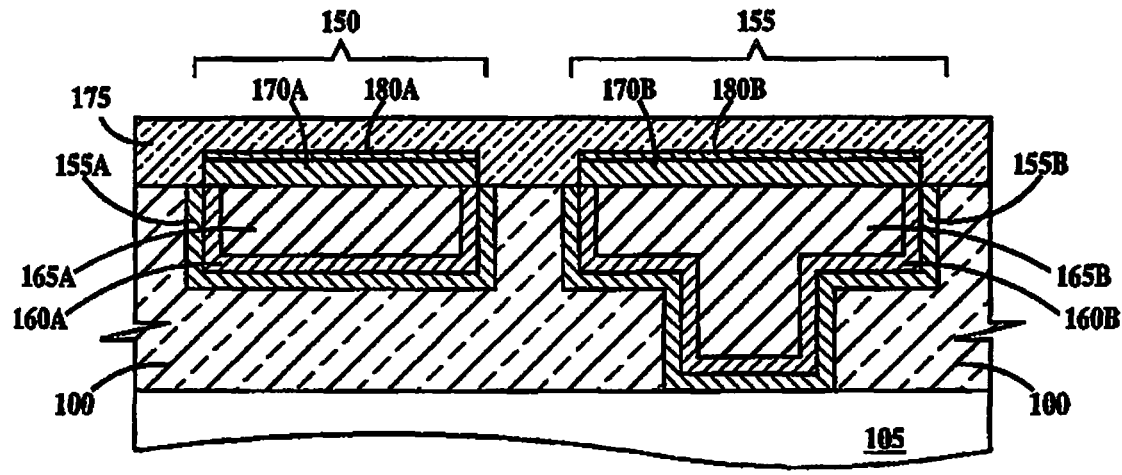
FIG. 3D
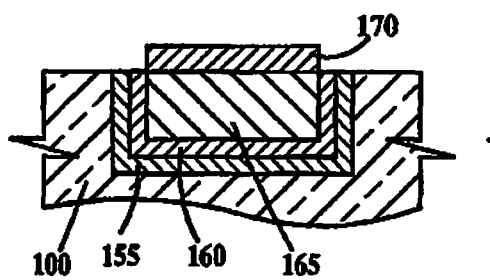 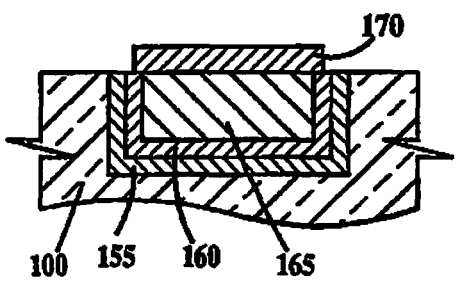
FIG. 4A  FIG. 4B
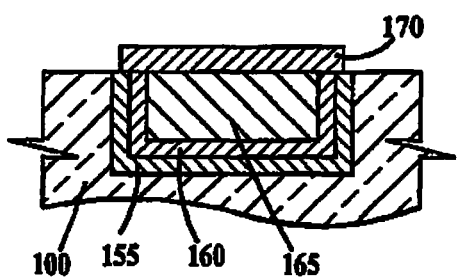 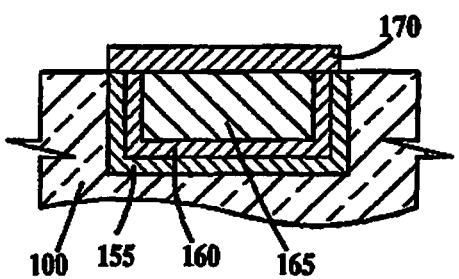
FIG. 4C  FIG. 4D

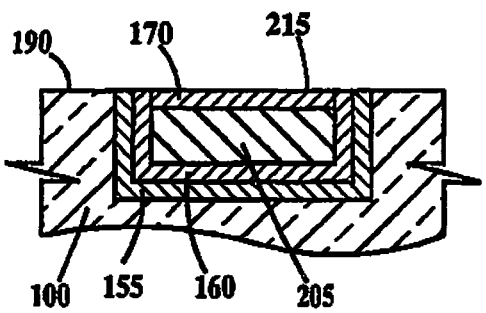
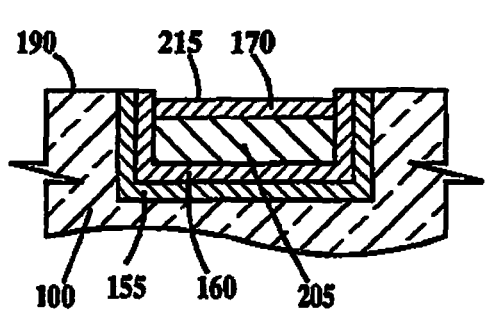
*FIG. 6A*  *FIG. 6B*
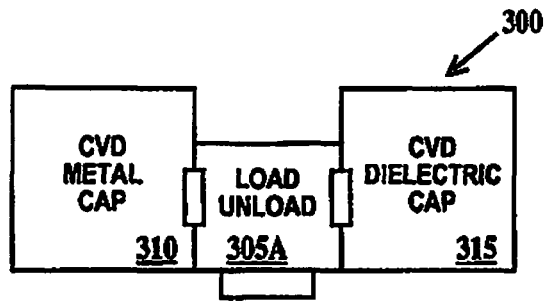
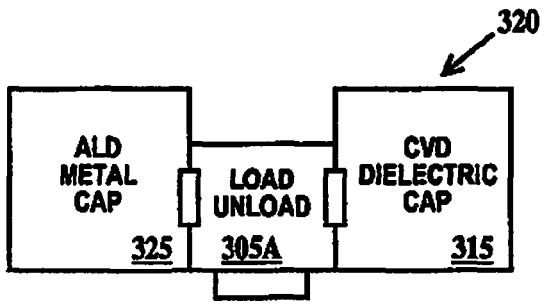
*FIG. 7A*  *FIG. 7B*
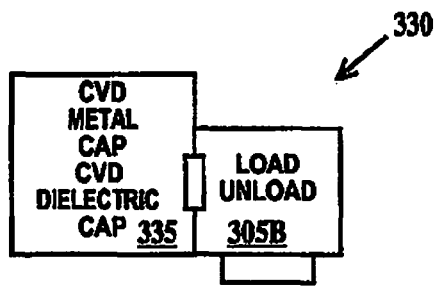
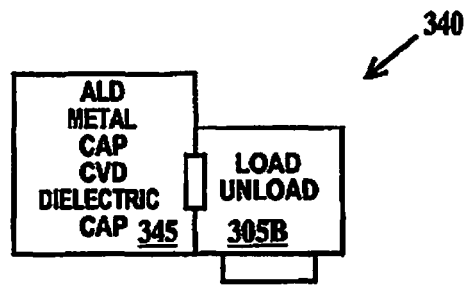
*FIG. 7C*  *FIG. 7D*

ULTRATHIN MULTILAYER METAL ALLOY LINER FOR NANO CU INTERCONNECTS

RELATED APPLICATIONS

This application is a Divisional Application pursuant to 35 U.S.C. § 121 of Parent application Ser. No. 14/298,938 Filed: Jun. 8, 2014 which is incorporated herein by reference in its entirety, the present application also claiming the benefits of this Parent Application pursuant to 35 U.S.C. § 120.

FIELD OF THE INVENTION

The field of the invention in one aspect comprises interconnection structures (interconnects) in microelectronic circuits including high speed microprocessors, application specific integrated circuits, memory storage devices, and related electronic structures. More particularly this invention relates to ultra thin liner layers for protecting interconnect-metallization in nano Back End Of Line (BEOL) Cu interconnect structures in such microelectronic circuits as well as processes, compositions, and tools for forming such interconnects. The present invention also relates to semiconductor interconnect compositions having enhanced electromigration (EM), stress migration, and time-dependent-dielectric-breakdown (TDDB) reliability, as well as processes and tools for applying these compositions to such interconnects as ultra thin layers

BACKGROUND OF THE INVENTION

The so-called "silicon revolution" brought about the development of faster and larger computers beginning in the early 1960s with predictions of rapid growth because of the increasing numbers of transistors packed into integrated circuits with estimates they would double every two years. Since 1975, however, they doubled about every 18 months.

An active period of innovation in the 1970s followed in the areas of circuit design, chip architecture, design aids, processes, tools, testing, manufacturing architecture, and manufacturing discipline. The combination of these disciplines brought about the VLSI era and the ability to mass-produce chips with 100,000 transistors per chip at the end of the 1980s, succeeding the large scale Integration ("LSI") era of the 1970s with only 1,000 transistors per chip. (Carre, H. et al. "Semiconductor Manufacturing Technology at IBM", *IBM J. RES. DEVELOP.*, VOL. 26, no. 5, September 1982). Mescia et al. also describe the industrial scale manufacture of these VLSI devices. (Mescia, N. C. et al. "Plant Automation in a Structured Distributed System Environment," *IBM J. RES. DEVELOP.*, VOL. 26, no. 4, July 1982). These VLSI devices have now been advanced to the next level of miniaturization referred to as Ultra-Large Scale Integrated (ULSI) microelectronic circuits.

The release of IBM's Power6™ chip in 2007, noted this ULSI "miniaturization has allowed chipmakers to make chips faster by cramming more transistors on a single slice of silicon, to the point where high-end processors have hundreds of millions of transistors." (http://www.nytimes.com/reuters/technology/tech-ibm-ower.html?pagewanted=print (Feb. 7, 2006)).

Technology scaling of semiconductor devices to 90 nm and below has provided many benefits in the field of microelectronics, but has introduced new considerations as well. While smaller chip geometries result in higher levels of on-chip integration and performance interconnect structures the nano structures employed introduce new considerations that the industry has to address such as protecting nano structure interconnects in BEOL structures such as ULSI microelectronic circuits.

Traditional semiconductor devices, consisting of aluminum and aluminum alloys have been used as interconnect metallurgies for providing electrical connections to and from devices in BEOL layers. While aluminum-based metallurgies have been the material of choice for use as metal interconnects in the past, aluminum no longer satisfies the requirements for increased circuit density and speed in semiconductor devices as the scale of devices decreases. More advanced manufacturing therefore employs copper as a replacement for aluminum, because of its lower susceptibility to electromigration (EM) failure and its lower resistivity as compared to aluminum.

Since the 1960's electromigration (EM) has been identified as significant metal failure mechanisms in semiconductor interconnect structures, especially for very large scale integrated (VLSI) circuits and manufacturing as well as ultra large scale integrated (ULSI) circuits and manufacturing. The problem not only needs to be overcome during the process development period in order to qualify the process, but it also persists through the lifetime of the chip, which the industry refers to as time-dependent-dielectric-breakdowns (TDDB's). EM, results from voids created inside the metal conductors of an interconnect structure due to metal ion movement caused by the high density of current flow.

Although the fast diffusion path in metal interconnects varies depending on the overall integration scheme and materials used for chip fabrication, it has been observed that metal atoms, such as Cu atoms, transported along the metal/post planarized dielectric cap interface play an important role on the EM lifetime projection. The EM initial voids first nucleate at the metal/dielectric cap interface and then grow in the direction to the bottom of the metal interconnect, which eventually results in a circuit dead opening.

Circuit interconnects comprising vias known in the art contain a copper core surrounded by a liner to protect against EM, stress migration and TBBD breakdown caused by minimization of circuits and concomitant decreases in wire dimension that brings about increases in current density.

Liner layers and capping layers are also used in copper interconnect technology to prevent corrosion of the copper wires by sealing the top surfaces of the wires between wiring levels. Again, as wire dimensions decrease, current density increases and the "weakest" sites for resisting EM failure are the liner layer and the capping layer copper interface. Metal liner layers and capping layers improve EM performance but at the cost of increased copper corrosion.

RELATED ART

Ishizaka et al U.S. Pat. No. 8,242,019, Iwasaki U.S. Pat. No. 7,977,239, Abe U.S. Pat. No. 7,211,505, Yakobson et al. U.S. Pat. No. 7,393,781, Bao et al. U.S. Pat. No. 8,129,269, Bonilla et al. U.S. Pat. No. 7,749,892, Dubin et al. U.S. Pat. No. 7,008,872, Goodner et al., U.S. Pat. No. 7,344,972, Lin et al. U.S. Pat. No. 8,202,783, Yang et al., United States Patent Application No. 2011/0049716 all show various state of the art liner structures.

SUMMARY OF THE INVENTION

The present invention comprises structures, articles of manufacture and processes that address these needs not only to provide advantages over the related art, but also to obviate substantially one or more of the foregoing and other limitations and disadvantages of the related art. The present invention provides compositions of matter, compounds, articles of manufacture and processes to reduce or substantially eliminate EM and/or stress migration, and/or TDDB in copper interconnects in microelectronic devices and circuits, especially the metal liners described above, by means of an ultra thin layer or layers of Mn alloys containing W and/or Co. This novel alloy composition provides EM and/or stress migration, and/or TDDB resistance in copper interconnects in microcircuits comparable to thicker layers of other alloys found in substantially larger circuits and allows the miniaturization of the circuit without having to use thicker EM and/or TDDB resistant alloys previously used thereby enhancing the degree of miniaturization. Stated otherwise, these novel alloy layers can be miniaturized along with the circuit and provide substantially the same EM and/or TDDB resistance as thicker layers of different alloy materials previously used. In prior art, CoWP metal alloy Cap, the stress migration/EM performance are strongly dependent on the CoWP thickness (J. Gambino et al., IEEE TRANSACTIONS ON DEVICE AND MATERIALS RELIABILITY, VOL 6, NO. 2, JUNE 2006, and Interconnect Technology Conference, 2005. Proceedings of the IEEE 2005 International, pp. 111-113_)

Not only do the written description, drawings (Figures) claims, and abstract of the disclosure set forth various features, objectives, and advantages of the invention and how they may be realized and obtained, but these features, objectives, and advantages will also become apparent by practicing the invention.

BRIEF DESCRIPTION OF THE DRAWINGS

The accompanying drawings are not necessarily drawn to scale but nonetheless set out the invention, and are included to illustrate various embodiments of the invention, and together with this specification also serve to explain the principles of the invention. These drawings comprise various Figures that illustrate, inter alia, structures and processes for practicing the invention.

FIGS. 3A through 3D comprise side elevations in cross-section illustrating fabrication of in-situ of metal alloy liners and in-situ formation of metal cap/dielectric cap on the wires of FIG. 1 according to a second embodiment of the invention.

FIGS. 4A through 4D comprise side elevations in cross-section illustrating variations to the first and second embodiments of the present invention.

FIGS. 5A through 5C and 5E-5F comprise side elevations in cross-section illustrating fabrication in-situ of metal alloy liners and in-situ formation of metal cap/dielectric cap on the wires of FIG. 1 according to a fourth embodiment of the invention.

FIGS. 6A and 6B comprise side elevations in cross-section illustrating variations to the third and fourth embodiments of the present invention.

FIGS. 7A through 7D illustrate a first set of tools for forming in-situ interconnects and the formation of metal alloy liners according to the first and third embodiments of the present invention.

DETAILED DESCRIPTION OF THE INVENTION

Figure 1A:
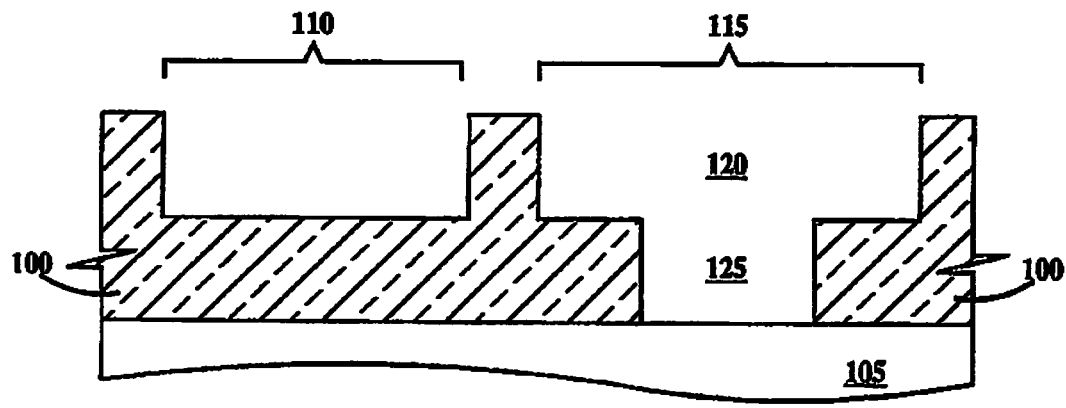
FIGS. 1A through IE are side elevations in cross-section illustrating fabrication of damascene and dual-damascene interconnect wires according to embodiments of the present invention.
Figure 1B:
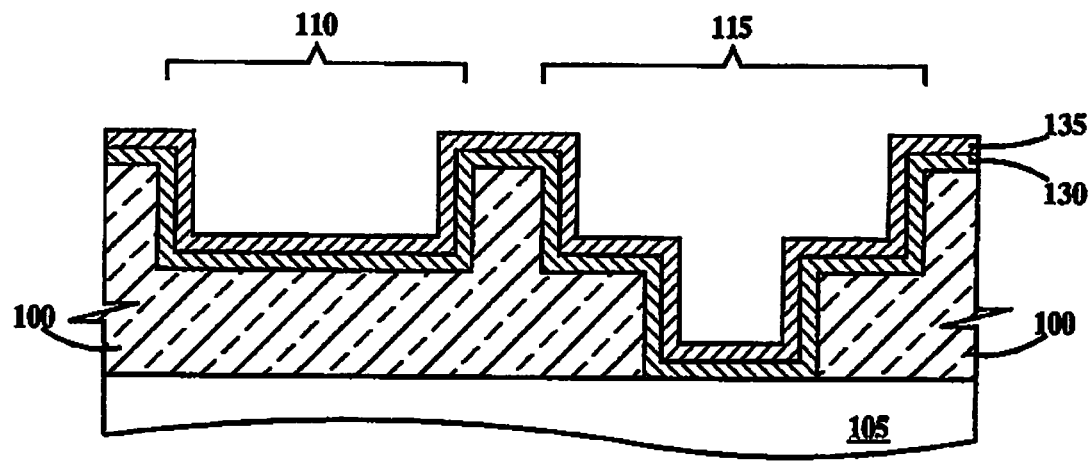

To achieve the foregoing and other advantages, and in accordance with the purpose of this invention as embodied and broadly described herein, the following detailed description comprises disclosed examples of the invention that can be embodied in various forms.

The specific processes, compounds, compositions, and structural details set out herein not only comprise a basis for the claims and a basis for teaching one skilled in the art how to employ the present invention in any novel and useful way, but also provide a description of how to make and use this invention. This written description, claims, abstract of the disclosure, and drawings set forth various features, objectives, and advantages of the invention and how they may be realized and obtained. These features, objectives, and advantages will also become apparent by practicing the invention.

The invention comprises, among other things:

(1) various processes (CVD/ALD selective and non-selective) and Cu nano interconnect structures formation with an ultra thin nano layer liner (from about 0.3 to about 1 nm thick) selective liner layer of alloys of Co/Mn, Co/Mn/W, W/Mn, W/Mn/Co and various alloy combination of Co/Mn/W layers as ultra thin alloy liners to improve nano device's EM and TDDB. These could be deposited sequentially, or co-deposited by concurrent flow of multiple precursors, so as to produce a nano-layer Mn metal alloy liner film. The amount of each element in the alloy, ranges from about 0.1 to about 20 parts by weight of Mn; about 0 to about 100 parts by weight of W; and about 0 to about 100 parts by weight of Co to form Co/Mn, Co/Mn/W, W/Mn, and W/Mn/Co alloys;

(2) various processes and Cu nano interconnect structure formation with nano layer liners (about 0.3 to about 1 nm thick) selective Co/Mn, Co/Mn/W, W/Mn, W/Mn/Co and various combinations of Co/Mn/W layers as ultra thin metal alloy liners to improve nano device's EM resistance and TDDB resistance;

(3) UV or/and Low rf/down stream plasma or thermal cure treatment in reactive hydrogen or other reducing environments (H2, NH3,CO and art-known equivalents) or inert gas (N, Ar, He, .Ne, Kr, Xe and art-known equivalents) ambient to enhance the reaction/intermixing between each layer and between Cu/Metal alloy interfaces;

(4) multilayer metal and alloy liners in Cu interconnects;

(5) the above processes, to form non-corrosive coatings for thick/large Cu wiring levels, such as metal pads used in C4 flip-chip and wire bonds, or high-Q inductors, laser-blown fuses, and the like; (the thickness of the substrate is from about 100 mu to about 10000 mu)

(6) the above processes for manufacturing Cu-based MEMS elements, such as switches and resonators, where a self-aligned corrosion-resistant coating is required;

(7) integrated in-situ apparatus configuration/processes as illustrated in FIGS. 7A-7D and 8A-8C for manufacturing these structures where the apparatus has 3 chambers with the option of 4/5 chambers for multilayer metals, metal alloys/ dielectric deposition with and without a cure treatment in a lower chamber of the apparatus.

Metal liner layers around and abutting copper via connectors are used in copper interconnect technology to prevent corrosion of the copper wires by sealing the side surfaces of the wires between wiring levels. Metal capping layers are also provided for the same reasons. As wire dimensions decrease however, current density increases and the "weakest" site for resisting electromigration failure is at the metal layer/copper interface. Metal liner layers and capping layers improve electromigration performance but at the cost of increased copper corrosion failures. The inventors have discovered that the increased corrosion failure rates are due to oxygen at the metal cap/copper and meta-Valloy liner interface caused by oxygen diffusion through the metal cap or alloy liner.

The present invention, inter alia, resolves these problems by providing a metal alloy liner on the surface of the copper metal conductor in the via and optionally a metal alloy capping layer on the copper metal conductor for improved electromigration and TDDB performance. A dielectric layer can also be employed as an oxygen barrier on the metal alloy liner capping layers. In the description that follows, the processes relating to the deposition and/or treatment of the caps also applies to the liners of the invention.

The best results however, are obtained when both the metal and dielectric layers are formed in a non-oxygen atmosphere and between depositing the metal alloy liner layer or capping layer and the copper interconnect structure (with the metal alloy liner or capping layer in place) is not exposed to oxygen (or other copper corroding material).

A damascene process is one in which wire trenches or via openings are defined by a patterned hardmask layer and etched into an underlying interlevel dielectric (ILD) layer, an electrical conductor of sufficient thickness to fill the trenches is deposited, and a chemical-mechanical-polish (CMP) process is performed to remove excess conductor and the hardmask layer and to make the surface of the conductor co-planar with the surface of the dielectric layer to form damascene wires (or damascene vias). When only a trench and a wire (or a via opening and a via) is formed the process is called single-damascene. The pattern in the hardmask is photolithographically defined.

A dual dual-damascene process is one in which wire trenches are defined by a patterned hardmask layer and etched partway into an underlying ILD layer followed by formation of vias inside the trenches through the remaining thickness of the ILD layer in cross-sectional view. All via openings are intersected by integral wire trenches above and by a wire trench below, but not all trenches need intersect a via opening. Thereafter the process is the same as for single-damascene wires.

In FIG. 1A, an ILD layer 100 is formed on a substrate 105. In semiconductor processing, substrate 105 is called a wafer and is a flat circular disk having, for example, diameters of 100, 125, 200 or 300 mm and thicknesses of about several hundred to about a thousand microns. Substrate 105 includes a semiconductor (e.g., silicon) layer on/and in which various dielectric and conductive layers have been built up to form devices such as transistors. Substrate 105 may also include other wiring levels having metal contacts, damascene wires and/or dual damascene wires formed in respective ILD layers. A first trench 110 and a second trench 115 are formed in ILD layer 100. Trench 110 is where a damascene wire will be formed. Trench 115 is where a dual-damascene wire will be formed. Trench 115 includes a wire opening 120 open to a via opening 125. Substrate 105 is exposed in the bottom of via opening 125. While first trench 110 is not open to substrate, in some applications, notably first wiring levels that contain only damascene wires, trench 110 will be open to substrate 105 and subsequently fabricated wires physically and electrically contact metal stud contacts and/or portions of devices such as field effect transistors, bipolar transistors, diodes, resistors, capacitors and other semiconductor devices.

In one example, ILD layer 100 comprises a porous or nonporous silicon dioxide ($SiO_2$), fluorinated $SiO_2$ (FSG) or a low K (dielectric constant) material, examples of which include but are not limited to hydrogen silsesquioxane polymer (HSQ), methyl silsesquioxane polymer (MS Q), SiLK™ (polyphenylene oligomer) manufactured by Dow Chemical, Midland, Tex., Black Diamond™ (methyl doped silica or $SiO_x(CH_3)_y$ or $SiC_xO_yH_y$ or SiOCH) manufactured by Applied Materials, Santa Clara, Calif., organosilicate glass (SiCOH), and porous SiCOH. A low K dielectric material has a relative permittivity of about 2.4 or less. In one example, ILD layer 100 is from about 50 nm to about 700 nm thick.

In FIG. IB, a first metal alloy liner layer 130 is formed on all exposed surfaces of ILD 100 and substrate 105. A second metal alloy liner layer 135 is formed on first metal alloy liner layer 130. In one example, a layer of Co and second liner layer 135 comprises MnW In one example, we provide a first liner layer of MnW and a second liner layer 135 that comprises Co and/or In another example, first liner layer 130 comprises a layer of MnCo and second liner layer 135 comprises W. In yet another example, first liner layer 130 comprises a layer of MnCo and second liner layer 135 comprises W.

The metal alloy liner layers in another aspect of the invention comprise alloys of Mn, with Co and/or W (i.e., a Co/Mn, Co/Mn/W, W/Mn, W/Mn/Co alloy) in the following amounts:

Mn, about 0.1 to about 20 parts by weight;
Co, 0 to about 100 parts by weight;
W, 0 to about 100 parts by weight.

We form these alloy metal liners by depositing precursors of Mn, with Co and/or W precursors sequentially, or codepositing the precursors by concurrent flow of multiple precursors, so as to produce a nano-intercalated metal alloy liner film or series of metal films, i.e., a series of metal layers that alloy with one another or a series of metal alloy layers.

Figure 1C:
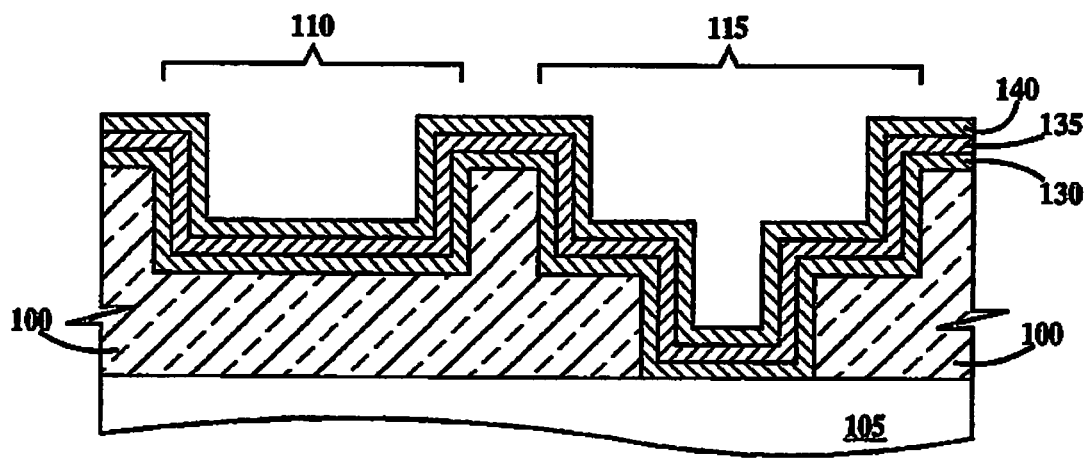
Figure 1D:
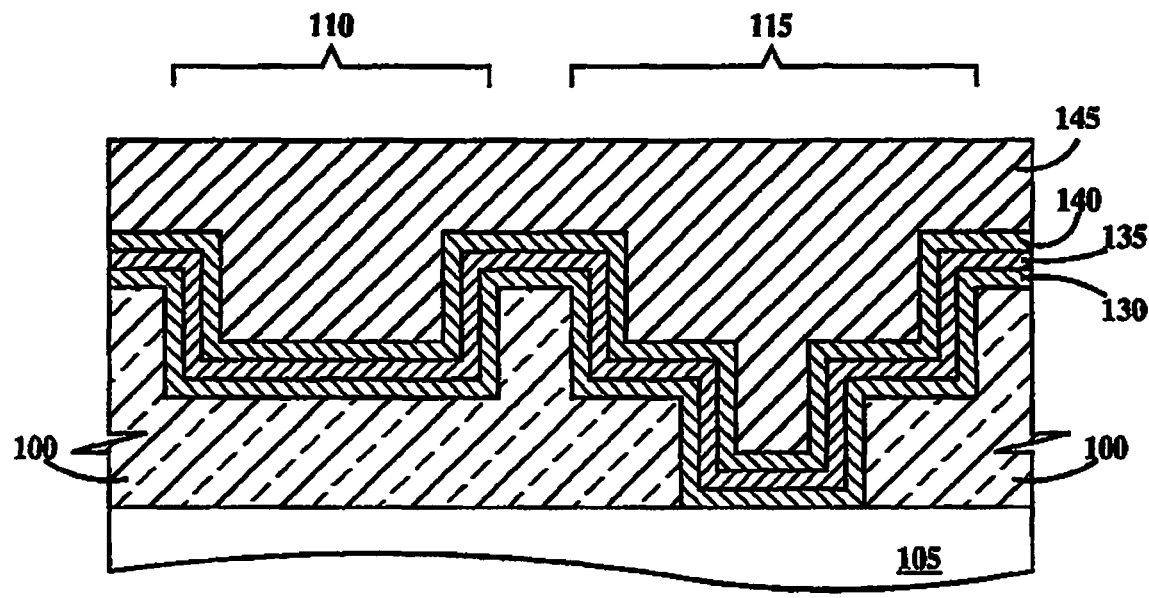
Figure 1E:
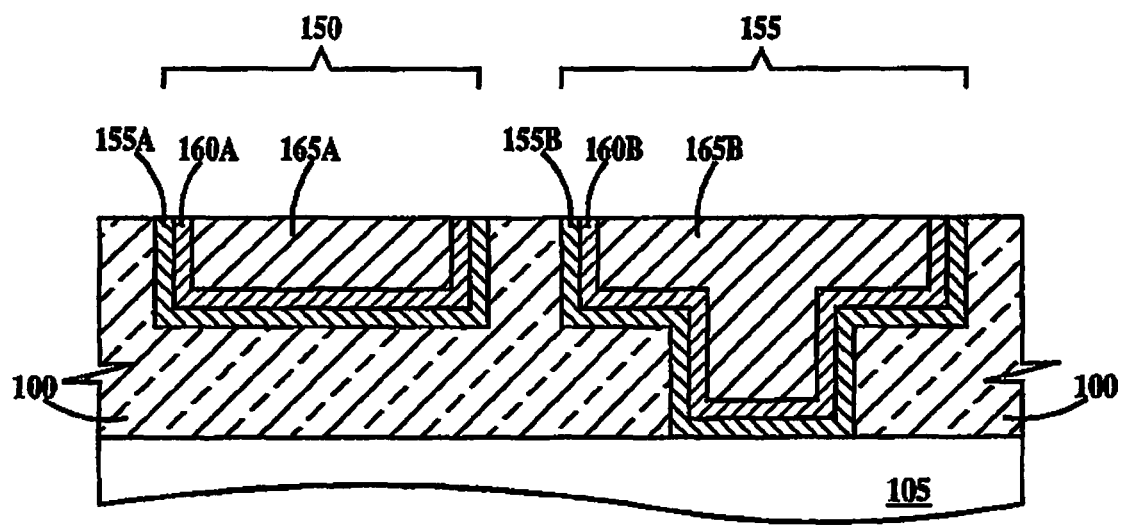

In FIG. 1C, a copper seed layer 140 is formed on second metal alloy liner layer 135. In one example, copper seed layer 140 may be formed, for example, by evaporation or sputter deposition. In FIG. ID, a copper layer 145 is formed on copper seed layer 140. In one example, copper layer 145 is formed by electroplating.

In FIG. IE, a CMP has been performed to form a damascene wire 150 in trench 110 (see FIG. ID) and a dual damascene wire 155 in trench 115 (see FIG. ID). Wire 110 includes a first metal alloy liner 155A (formed from first metal alloy liner layer 130 of FIG. ID), a second metal alloy liner 160A (formed from second metal alloy liner layer 135 of FIG. ID) and a copper core conductor 165A formed from copper seed layer 140 and copper layer 145 of FIG. ID). Wire 115 includes a first metal alloy liner 155B (formed from first metal alloy liner layer 130 of FIG. ID), a second metal alloy liner 160B (formed from second metal alloy liner layer 135 of FIG. ID) and a copper core conductor 165B formed from copper seed layer 140 and copper layer 145 of FIG. ID). After CMP, the top surfaces of wires 150 and 155 are substantially coplanar with a top surface of ILD 100.

Figure 2A:
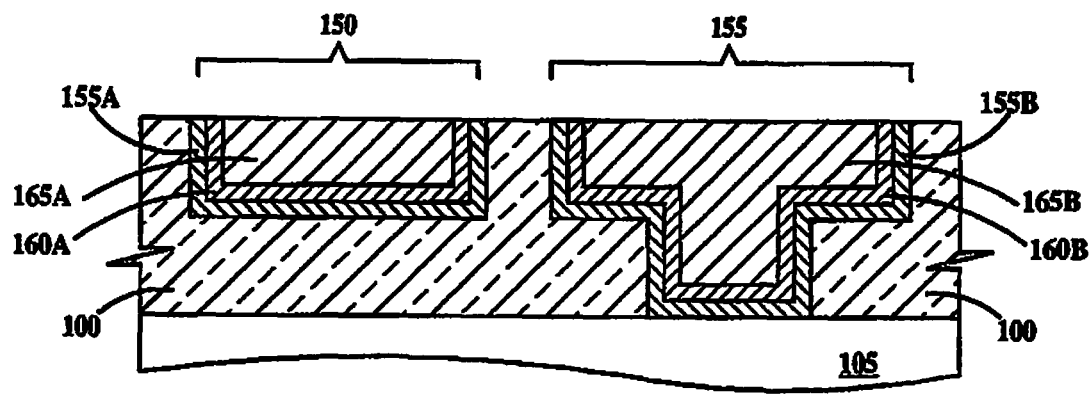
FIGS. 2A through 2C comprise side elevations in cross-section illustrating fabrication of in-situ of metal alloy liners and in-situ formation of metal cap/dielectric cap on the wires of FIG. 1 according to a first embodiment of the invention.
Figure 2B:
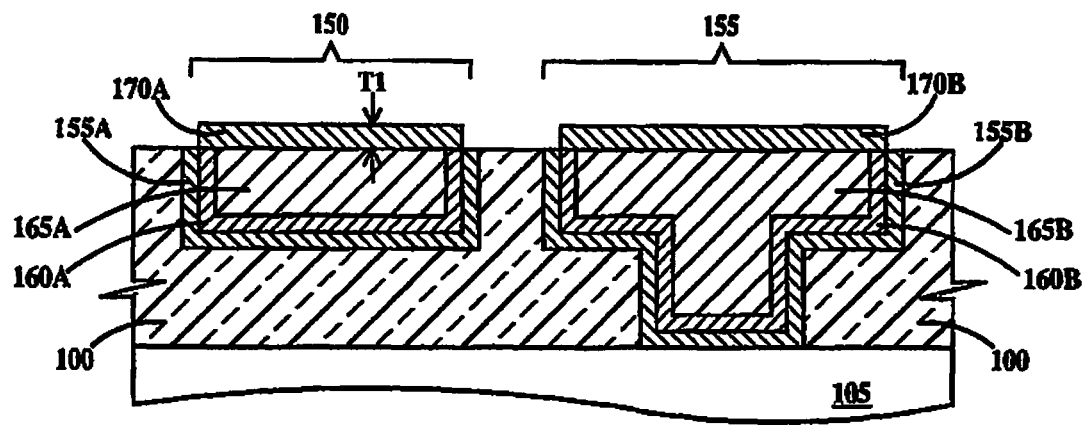
Figure 2C:
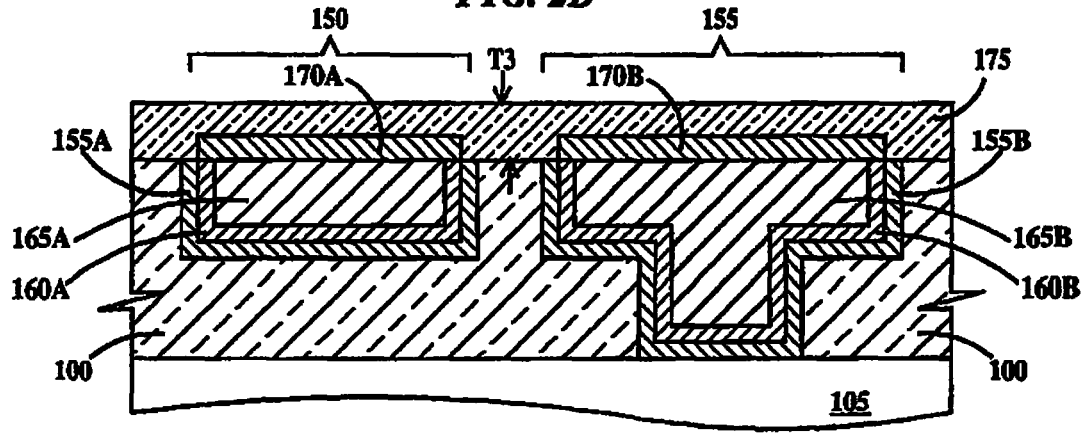

FIGS. 2A through 2C are side elevations in cross-section illustrating fabrication of in-situ metal/dielectric caps over the wires of FIG. 1 according to a first embodiment of the present invention. FIG. 2A is the same as FIG. IF. However, an optional clean (wet or reactive ion etch (RIE)) may be performed prior to loading the wafer (substrate 105) into the chamber that will form the metal capping layer illustrated in FIG. 2B.

In FIG. 2B, a selective metal cap 170A is formed on wire 150 and a selective metal cap 170B is simultaneously formed on the top surface of wire 155. The entire top surfaces of copper core 165A or copper core 165B are covered by respective metal caps 170A and 170B. Metal caps 170A and 170B have a thickness TI. In one example TI is from about 1 nm to about 50 nm. In one example metal caps 170A and 170B consist of one or more metals known in the art. In one example, metal caps 170A and 170B Ruthenium (Ru), cobalt (Co), Ti, palladium (Pd), nickel (Ni), gold (Au), iridium (Ir), manganese (Mn), W and combinations thereof, with Ru, Mn, Co and combinations thereof preferred and Ru most preferred.

Metal caps 170A and 170B are formed by selective deposition of the metal on Cu. The selective deposition techniques include chemical vapor deposition (CVD) and atomic layer deposition (ALD). It is a feature of the present invention that metal caps 170A and 170B be formed in a non-oxygen (i.e., no free O, $O_2$, or $O_3$) atmosphere. Selective processes according to embodiments of the present invention involve self-complementary materials and are self-limiting depositions of a metal from a reactive vapor phase compound of the metal exclusively on exposed Cu. The Mn, or W, or Co composition of 170A and/or 170B referred to below comprises a Co/Mn, Co/Mn/W, W/Mn, W/Mn/Co alloy:

Mn, about 0.1 to about 20 parts by weight;
Co, 0 to about 100 parts by weight;
W, 0 to about 100 parts by weight.

In one example, Mn may be selectively deposited on Cu using Manganese hexacacarbonyl ($Mn(CO)_6$) precursor or the Manganese amidinate in a CVD reaction. Cobalt, (Co) may be selectively deposited on Cu using dicarbonyl (h5-2,4-cycopentadien-I-yl)Co precursor in a CVD reaction. Tungsten, (W) may be selectively deposited on Cu using tungsten hexacacarbonyl ($W(CO)_6$) precursor in a CVD reaction. Both Co Amidinate and Tungsten Amidinate can also be used as precursors. We also use the foregoing Mn, Co, and W precursors to form the liners of this invention.

In FIG. 2C, a dielectric cap 175 is formed on metal caps 170A and 170B, any exposed regions of wires 150 and 155 (e.g., exposed metal alloy liners) and on ILD 100. Dielectric cap has a thickness T3. In one example, T3 is from about 5 nm to about 100 nm. It is a feature of the present invention that the formation of dielectric cap 175 is performed in a non-oxygen atmosphere and that the structure of FIG. 2B not exposed to oxygen before dielectric cap 175 is formed. Dielectric cap 175 is formed by blanket or non-selective CVD. In one example, dielectric cap 175 is silicon nitride ($Si_3N_4$) or (SiN), silicon carbide (SiC), Silicon oxynitride (SiNO) or amorphous silicon carbonitride ($SiC_yN_x$:H). It is a feature of the present invention that dielectric cap 175 be formed in a non-oxygen (i.e., no free O, O.sub.2, or O.sub.3) atmosphere. The CVD reactants may contain bound oxygen atoms that are released as bound oxygen atoms (e.g., CO, $CO_2$) by the deposition reaction. It is preferred that dielectric cap 175 not be formed from a material containing oxygen. The metal cap 170A and 170B to core conductor 165A and 165B interfaces do not contain oxygen.

Figure 3A:
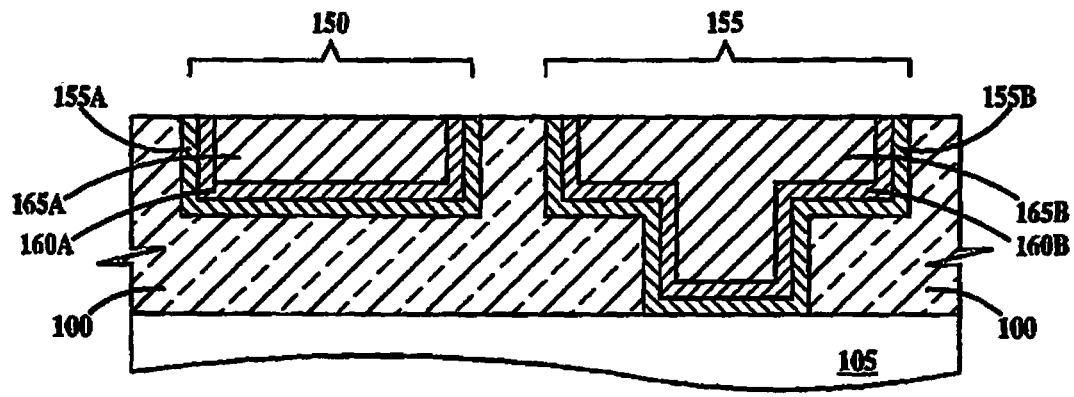
Figure 3B:
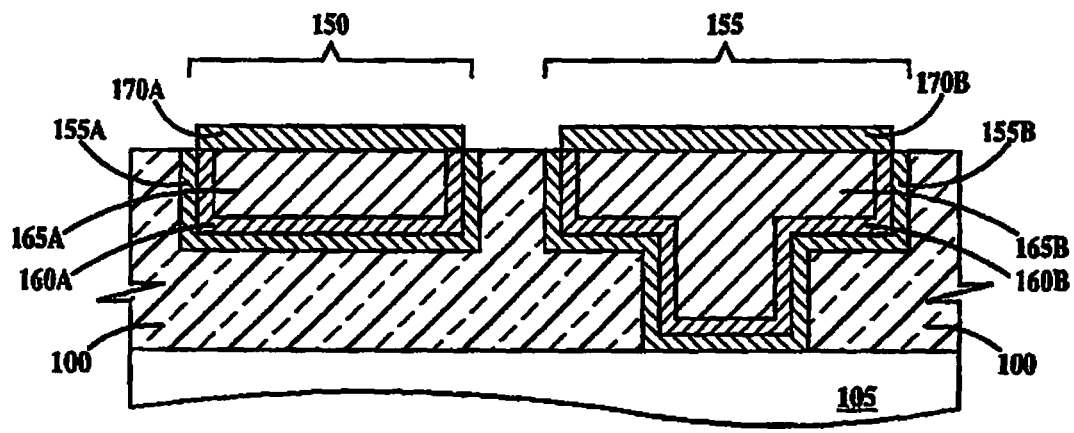

FIGS. 3A through 3D are side elevations in cross-section illustrating fabrication of in-situ metal/dielectric caps over the wires of FIG. 1 according to a second embodiment of the present invention. The second embodiment differs from the first, only in that an additional step is performed between the step illustrated in FIG. 2B and the step illustrated in FIG. 2C. FIGS. 3A and 3B therefore are the same as FIGS. 2A and 2B. An optional clean (wet or reactive ion etch (RIE)) may be performed prior to loading the wafer (substrate 105) into the chamber that will form the metal capping layer illustrated in FIG. 3B.

Figure 3C:
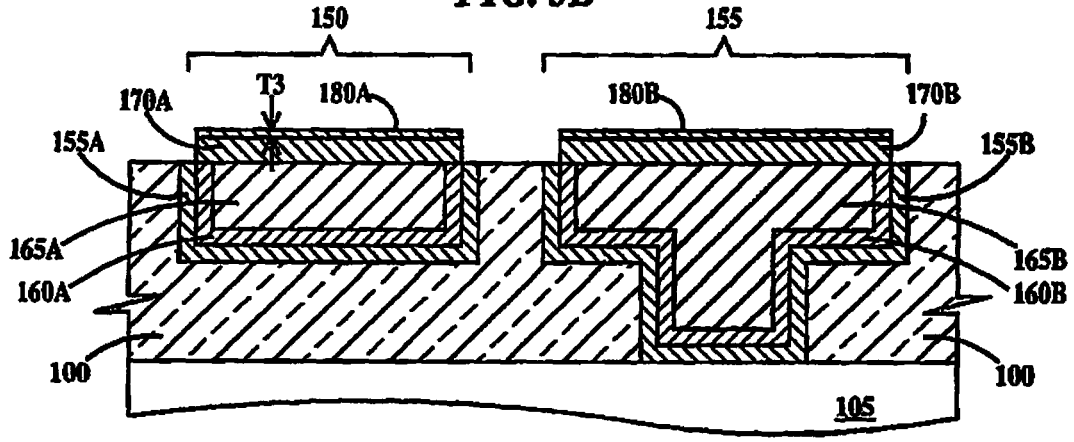

In FIG. 3C, alloy caps 180A and 180B are simultaneously formed on respective metal caps 170A and 170B. Alloy caps 180A and 180B have a thickness T3. In one example, T3 is from about 0.5 nm to about 5 nm. Exemplary materials for alloy caps 180A and 180B include, but are not limited to Co, W, and Mn. The Mn, W, Co composition of 180A and 180B comprise a Co/Mn, Co/Mn/W, W/Mn, W/Mn/Co alloy:

Mn, about 0.1 to about 20 parts by weight;
Co, 0 to about 100 parts by weight;
W, 0 to about 100 parts by weight.

Alloy caps 180A and 180B are formed by selective deposition on metal caps 170A and 170B respectively. The selective deposition technique include chemical vapor CVD and ALD. It is a feature of the present invention that alloy caps 180A and 180B be formed in a non-oxygen (i.e., no free O, $O_2$, or $O_3$) atmosphere. It is a feature of the present invention that the structure of FIG. 3B not be exposed to oxygen before alloy caps 180A and 180B are formed.

FIG. 3D is similar to FIG. 2C except for the presence of alloy caps 180A and 180B. It is a feature of the present invention that dielectric cap 175 be formed in a non-oxygen (i.e., no free O, $O_2$, or $O_3$) atmosphere. Dielectric cap 175 is formed on alloy caps 180A and 180B, any exposed regions of metal caps 170A and 170B, any exposed regions of metal alloy liners 155A, 155B, 160A and 160B and ILD 100. It is a feature of the present invention that the structure of FIG. 3C not be exposed to oxygen before dielectric cap 175 is formed. The metal cap 170A and 170B to core conductor 165A and 165B interfaces do not contain oxygen.

FIGS. 4A through 4D are side elevations in cross-section illustrating variations to the first and second embodiments of the present invention. Returning to FIG. 2B or 3B, the edges of metal caps 170A and 170B are aligned to respective metal alloy liner 155A/160A and metal alloy liner 155B/160B interfaces. This is a first variation. In FIG. 4A, a metal cap 170 is aligned to the metal alloy liner 160/core conductor interface. This is a second variation. In FIG. 4B, metal cap 170 overlaps metal alloy liner 160, but not metal alloy liner 155. This is a third variation. In FIG. 4C, metal cap 170 overlaps metal alloy liners 160 and 155 but not ILD 100. This is a fourth variation. In FIG. 4D, metal cap 170 is aligned to the metal alloy liner 155/ILD 100 interface. In a fifth variation, metal cap layer 170 overlaps ILD 100 in a region immediately adjacent to metal alloy liner 155.

Figure 5A:
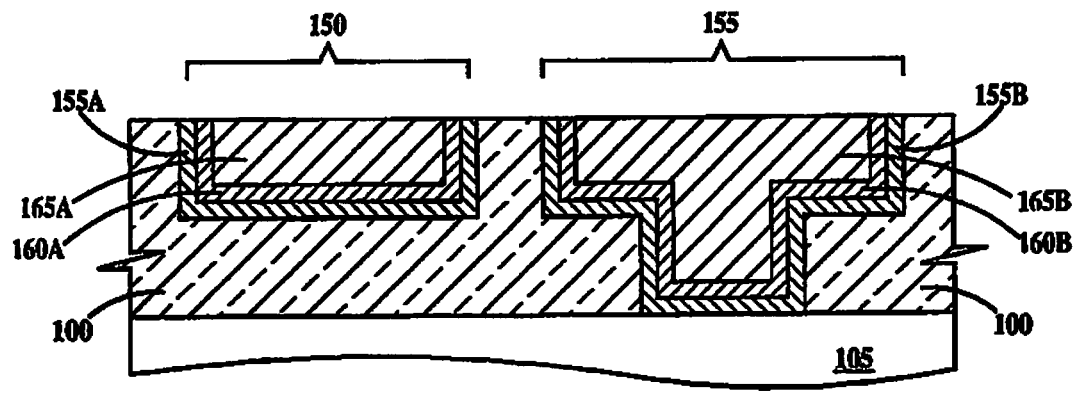
FIGS. 5A through 5D comprise side elevations in cross-section illustrating fabrication in-situ of metal alloy liners and in-situ formation of metal cap/dielectric cap on the wires of FIG. 1 according to a third embodiment of the invention.
Figure 5B:
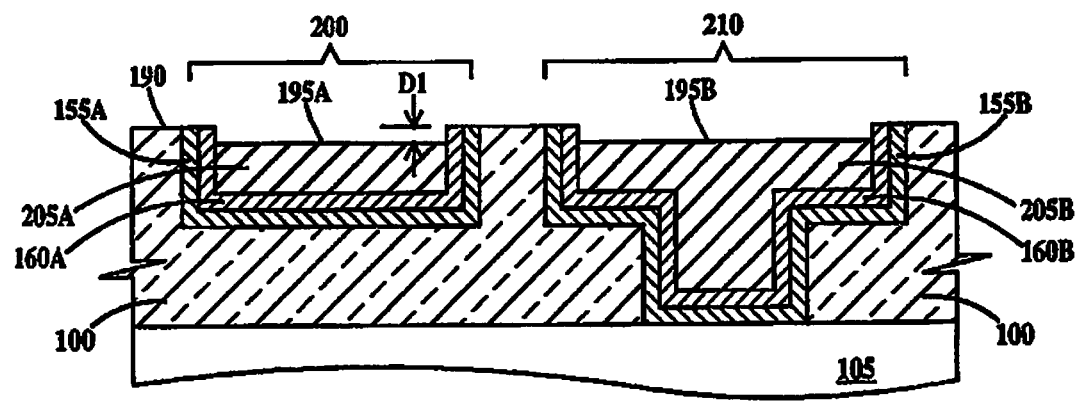

FIGS. 5A through 5D are side elevations in cross-section illustrating fabrication of in-situ metal/dielectric caps over the wires of FIG. 1 according to a third embodiment of the present invention. FIG. 5A is the same as FIG. IE. In FIG. 5B, a copper recess etch is performed on core conductors 185A and 185B of FIG. 5A to form recessed core conductors 205A and 205B of respective wires 200 and 210. Respective top surfaces 195A and 195B of core conductors 205A and 205B are recessed below top surface 190 of ILD 100 a distance DI. In one example, DI is from about 10 to about 50 nm, preferably from about 20 and 35 nm.

Figure 5C:
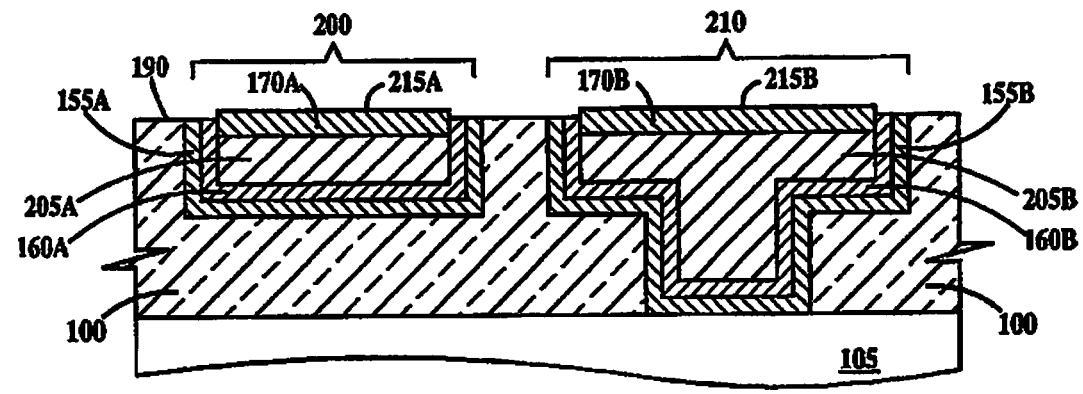

In FIG. 5C, metals caps 170A and 170B are formed on respective core conductors 205A and 205B. In the example of FIG. 5C, respective top surfaces 215A and 215B of metal caps 170A and 170B extend above top surface 190 of ILD 100. Processes for forming and materials for metal caps 170A and 170B have been discussed supra. No portions of core conductors 205A or 205B are exposed.

Figure 5D:
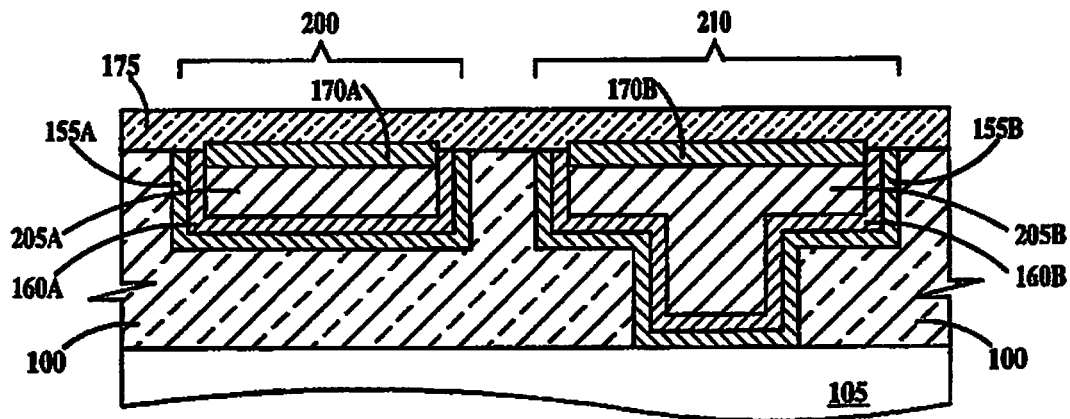

In FIG. 5D, dielectric cap 175 is formed on metal caps 170A and 170B, any exposed regions of wires 200 and 210 (e.g., exposed metal alloy liners) and on ILD 100. It is a feature of the present invention that dielectric cap 175 be formed in a non-oxygen (i.e., no free O, $O_2$, or $O_3$) atmosphere. It is a feature of the present invention that the structure of FIG. 5C is not exposed to oxygen before dielectric cap 175 is formed. The metal cap 170A and 170B to core conductor 165A and 165B interfaces do not contain oxygen. It is preferred that dielectric cap 175 not be formed from a material containing oxygen.

Figure 5E:
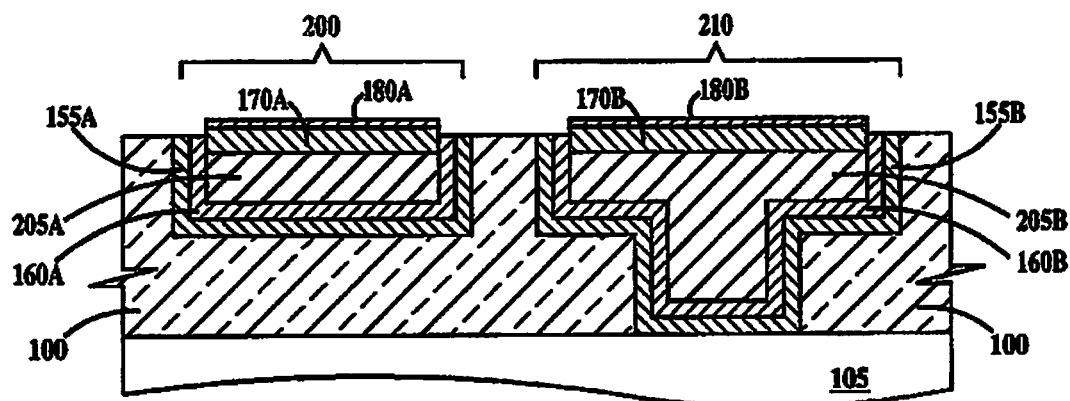
Figure 5F:
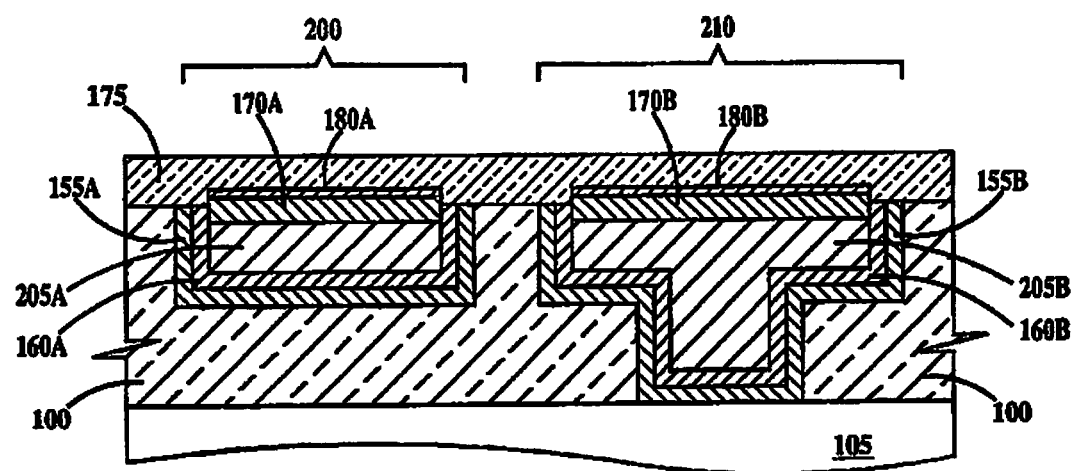

FIGS. 5A through 5C and 5E-5F are side elevations in cross-section illustrating fabrication of in-situ metal/dielectric caps over the wires of FIG. 1 according to a fourth embodiment of the present invention. FIGS. 5A through 5C have been discussed supra. In FIG. 5E alloy caps 180A and 180B are formed on respective metal cap 170A and 170B. Processes for forming and materials for alloy caps 180A and 180B have been discussed supra. It is a feature of the present invention that alloy caps 180A and 180B be formed in a non-oxygen (i.e., no free O, $O_2$, or $O_3$) atmosphere. It is a feature of the present invention that the structure of FIG. 5C not be exposed to oxygen before alloy caps 180A and 180B are formed. In FIG. 5F, dielectric cap 175 is formed on alloy caps 180A and 180B, any exposed regions of alloy caps 170A and 170B, any exposed regions of wires 150 and 155 (e.g., exposed metal alloy liners) and on ILD 100. It is a feature of the present invention that dielectric cap 175 be formed in a non-oxygen (i.e., no free O, $O_2$, or $O_3$) atmosphere. It is a feature of the present invention that the structure of FIG. 5E not be exposed to oxygen before dielectric cap 175 is formed. The metal cap 170A and 170B to core conductor 165A and 165B interfaces do not contain oxygen.

FIGS. 6A and 6B are side elevations in cross-section illustrating variations to the third and fourth embodiments of the present invention. Returning to FIG. 5C, respective top surfaces 215A and 215B of metal caps 170A and 170B extend above top surface 190 of ILD 100. This is a first variation. In FIG. 6A, a top surface 215 off a metal cap 170 is coplanar with top surface 190 of ILD 100. This is a second variation. In FIG. 6B, top surface 215 of metal cap 170 extends above top surface 190 of ILD 100. This is a third variation.

FIGS. 7A through 7D illustrate a first set of tools for forming in-situ interconnects according to the first and third embodiments of the present invention. In FIGS. 7A through 7D it should be understood that a CVD chamber performs a CVD deposition process and an ALD chamber performs an ALD deposition process. An ALD/CVD chamber is capable of selectively performing either an ALD deposition process or a CVD deposition process. Further, CVD deposition of dielectric layers (dielectric caps) is a blanket or non-selective deposition.

In FIG. 7A, a deposition tool 300 includes a load/unload chamber 305A, a CVD chamber 310 and a CVD chamber 315. Load/unload chamber 305A is capable of being purged with a non-oxygen containing and inert gas, for example nitrogen ($N_2$). Load/unload chamber 305A includes a mechanism for loading and unloading wafers, for transferring wafers between chambers 305A, 310 and 315 of tool 300. Chambers 310 and 315 are connected to load/unload chamber 305A by ports, which can be closed during deposition. CVD chamber 310 is configured to deposit metal liners and CVD chamber 315 is configured to deposit dielectric liners or caps. In use, the following steps are performed: (1) a wafer(s) is loaded into load/unload chamber 305A and load/unload chamber 305A purged with inert gas, (2) the wafer(s) is transferred into CVD chamber 310 where metal liners are formed and then CVD chamber 310 is purged with an inert gas, (3) the wafer(s) is transferred from CVD chamber 310, through load/unload chamber 305A (which is essentially free of oxygen) to CVD chamber 315, without exposure to air or oxygen, where a dielectric liner is deposited and then CVD chamber 315 is purged with inert gas, (4) the wafer(s) is transferred from CVD chamber 315 to load/unload chamber 305A (which is essentially free of oxygen), and (5) the wafer(s) is unloaded from load/unload chamber 305A. All chambers are sealed except when the wafer(s) is being transferred, loaded or unloaded.

In FIG. 7B, a deposition tool 320 includes load/unload chamber 305A, an ALD chamber 325 and CVD chamber 315. ALD chamber 325 is configured to deposit metal liners and CVD chamber 315 is configured to deposit dielectric liners or caps. Load/unload chamber 305A includes a mechanism for loading and unloading wafers, for transferring wafers between chambers 305A, 315 and 325 of tool 320. Chambers 315 and 325 are connected to load/unload chamber 305A by ports, which can be closed during deposition. In use, the following steps are performed: (1) a wafer(s) is loaded into load/unload chamber 305A and load/unload chamber 305A purged with inert gas, (2) the wafer(s) is transferred into ALD chamber 325 where metal liners are formed and then ALD chamber 325 is purged with an inert gas, (3) the wafer(s) is transferred from ALD chamber 325, through the load/unload chamber 305A (which is essentially free of oxygen) to CVD chamber 315, without exposure to air or oxygen, where a dielectric liner is deposited and then CVD chamber 315 is purged with an inert gas, (4) the wafer(s) is transferred from CVD chamber 315 to load/unload chamber 305A (which is essentially free of oxygen), and (5) the wafer(s) is unloaded from load/unload chamber 305A. All chambers are sealed except when the wafer(s) is being transferred, loaded or unloaded. [0045] In FIG. 7C, a deposition tool 330 includes load/unload chamber 305B, and a CVD chamber 335 configured for CVD deposition of metals and dielectrics. Load/unload chamber 305B includes a mechanism for loading and unloading wafers and for transferring wafers between chambers 305B and 335 of tool 330. Chamber 335 is connected to load/unload chamber 305B by a port, which can be closed during deposition. In use, the following steps are performed: (1) a wafer(s) is loaded into load/unload chamber 305B and load/unload chamber 305 purged with inert gas, (2) the wafer(s) is transferred into CVD chamber 335 where metal liners are formed by CVD, then a dielectric liner is formed by CVD, and then CVD chamber 335 is purged with inert gas, (3) the wafer(s) is transferred from CVD chamber 335 to load/unload chamber 305B (which is essentially free of oxygen), and (4) the wafer(s) is unloaded from load/unload chamber 305B. All chambers are sealed except when the wafer(s) is being transferred, loaded or unloaded.

In FIG. 7D, a deposition tool 340 includes load/unload chamber 305, and an ALD/CVD chamber 345 configured for ALD deposition of metals and CVD deposition of dielectrics. Load/unload chamber 305B includes a mechanism for loading and unloading wafers and for transferring wafers between chambers 305A and 345 of tool 340. Chamber 345 is connected to load/unload chamber 305B by a port, which can be closed during deposition. In use, the following steps are performed: (1) a wafer(s) is loaded into load/unload chamber 305B and load/unload chamber 305B is purged with inert gas, (2) the wafer(s) is transferred into ALD/CVD chamber 345 where metal liners are formed by ADD, then a dielectric liner is formed by CVD and then ALD/CVD chamber 345 is purged with an inert gas, (3) the wafer(s) is transferred from ALD/CVD chamber 345 to load/unload chamber 305B (which is essentially free of oxygen), and (4) the wafer(s) is unloaded from load/unload chamber 305B. All chambers are sealed except when the wafer(s) is being transferred, loaded or unloaded.

Figure 8A:
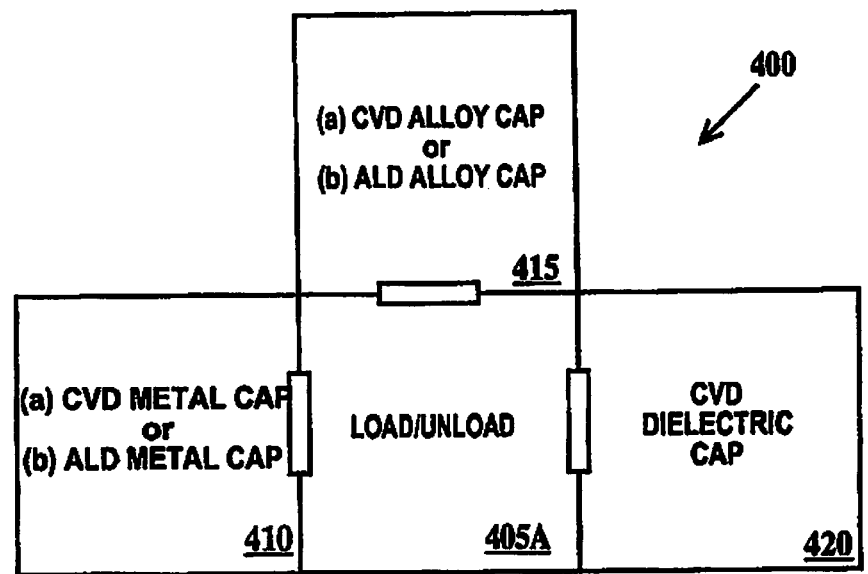
FIGS. 8A through 8C illustrate a second set of tools for forming in-situ interconnects and the formation of metal alloy liners according to the second and fourth embodiments of the invention.
Figure 8B:
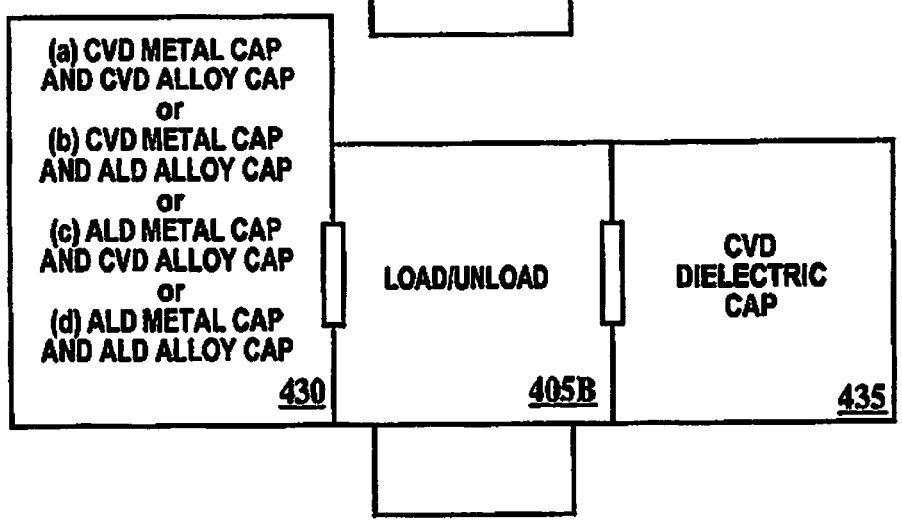
Figure 8C:
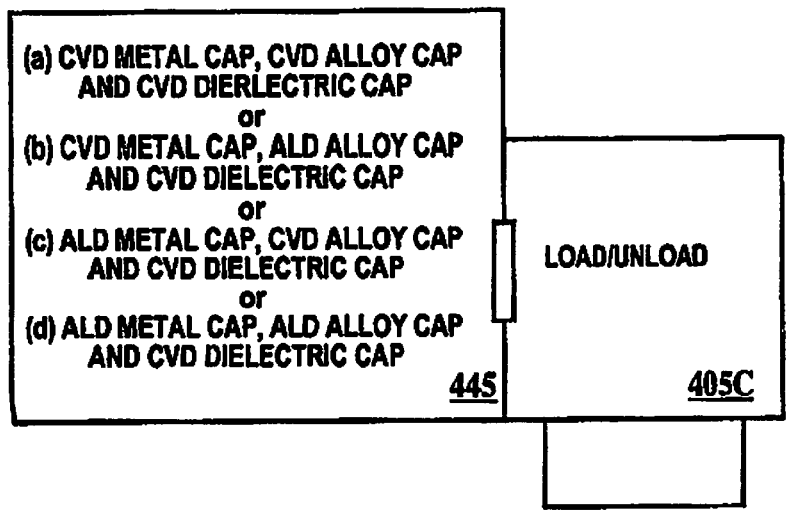

FIGS. 8A through 8C illustrate a second set of tools for forming in-situ interconnects according to the second and fourth embodiments of the present invention. In FIGS. 8A through 8C it should be understood that a CVD chamber performs a CVD deposition process and an ALD chamber performs an ALD deposition process. An ALD/CVD chamber is capable of selectively performing either an ALD deposition process or a CVD deposition process. Further, CVD deposition of dielectric layers (dielectric liners or caps) is a blanket or non-selective deposition, In FIG. 8A, a deposition tool 400 includes a load/unload chamber 405A, a first chamber 410, a second chamber 415 and a third chamber 420. First chamber 410 is configured to either form metal liners by (a) CVD or (b) metal liners by ALD but not both. Second chamber is configured to form alloy liners by (a) CVD or (b) ALD but not both. Third chamber 420 is configured to form a dielectric liner by CVD. Load/unload chamber 405B includes a mechanism for loading and unloading wafers and for transferring wafers between chambers 405A, 410, 415 and 420 of tool 400. Chambers 410, 415 and 420 are connected to load/unload chamber 405A by a port, which can be closed during deposition, Load/unload chamber 405A is capable of being purged with a non-oxygen containing and inert gas, for example $N_2$. In use, the following steps are performed: (1) a wafer(s) is tided into load/unload chamber 405A and the load/unload chamber purged with the inert gas, (2) the wafer(s) is transferred into first chamber 410 where metal liners are formed by either ALD or CVD and than first chamber 410 is purged with inert gas, (3) the wafer(s) is transferred from first chamber 410, through the load/unload chamber 405 (which is essentially free of oxygen) to second chamber 415, without exposure to air or oxygen, where alloy liners are formed by either ALD or CVD and then second chamber 415 is purged with inert gas, (4) the wafer(s) is transferred from second chamber 415, through load/unload chamber 405A (which is essentially free of oxygen) to third chamber 420, without exposure to air or oxygen, where a dielectric liner is formed by CVD and then third chamber 420 is purged with inert gas, (5) the wafer(s) is transferred from third chamber 420 to load/unload chamber 405A (which is essentially free of oxygen), and (6) the wafer(s) is unloaded from load/unload chamber 405A. All chambers are sealed except when the wafer(s) is being transferred, loaded or unloaded.

In FIG. 8B, a deposition tool 425 includes load/unload chamber 405B, a first chamber 430 and second chamber 435. Load/unload chamber 405B includes a mechanism for loading and unloading wafers, for transferring wafers between chambers 405B, 430 and 435 of tool 425. Chambers 430 and 435 are connected to load/unload chamber 405B by ports, which can be closed during deposition. First chamber 430 is configured to form (a) metal liners by CVD and alloy liners by VD, or (b) metal liners by CVD and alloy liners by ALD, or(c) metal liners by ALD and alloy liners by CVD or (d) metal liners by ALD and alloy liners by ALD. Second chamber 435 is configured to form a dielectric liner by CVD. Load/unload chamber 405B is capable of being purged with a non-oxygen containing and inert gas, for example $N_2$. In use, the following steps are performed: (1) a wafer(s) is loaded into load/unload chamber 405B and the load/unload chamber purged with the inert gas, (2) the wafer(s) is transferred into first chamber 430 where metal liners are formed by either ALD or CVD and then alloy liners are formed by either ALD or CVD and then first chamber 435 is purged with inert gas, (3) the wafer(s) is transferred from first chamber 430, through the load/unload chamber 405 (which is essentially free of oxygen) to second chamber 435, without exposure to air or oxygen, where a dielectric liner is formed by CVD and then second chamber 435 is purged with inert gas, (4) the wafer(s) is transferred from second chamber 435 to load/unload chamber 405B (which is essentially free of oxygen), and (5) the wafer(s) is unloaded from load/unload chamber 405B. All chambers are sealed except when the wafer(s) is being transferred, loaded or unloaded.

In FIG. 8C, a deposition tool 440 includes load/unload chamber 405C, and deposition chamber 455 configured to form (a) metal liners or caps, alloy liners and a dielectric liner by CVD, or (b) metal caps by CVD, alloy caps by ALD and a dielectric liner by CVD, or (c) metal alloy liners by ALD and a dielectric liner by CVD, or (d) metal liners and alloy liners by ALD and a dielectric liner by CVD. Load/unload chamber 405C includes a mechanism for loading and unloading wafers and for transferring wafers between chambers 405C and 445 of tool 440. Chamber 445 is connected to load/unload chamber 405C by a port, which can be closed during deposition. In use, the following steps are performed: (1) a wafer(s) is loaded into load/unload chamber 405C and the load/unload chamber purged with the inert gas, (2) the wafer(s) is transferred into process chamber 440 where metal caps are formed by either ALD or CVD, then alloy caps are formed by either ALD or CVD, then a dielectric liner is formed by CVD and then process chamber 440 is purged with inert gas, (3) the wafer(s) is transferred from process chamber 440 to load/unload chamber 405C (which is essentially free of oxygen), and (4) the wafer(s) is unloaded from load/unload chamber 405. All chambers are sealed except when the wafer(s) is being transferred, loaded or unloaded.

The immediately foregoing aspects of the disclosure therefore comprise a deposition tool that includes: a load/unload chamber; a mechanism for transferring a substrate between the load/unload chamber and a deposition chamber, the deposition chamber connected to the load/unload chamber by a port and wherein the deposition chamber is (i) configured to selectively form a metal layer or layers on copper by chemical vapor deposition or by atomic layer deposition and (ii) is configured to form a dielectric layer by chemical vapor deposition.

The deposition tool of this aspect of the disclosure is further configured to selectively deposit a metal alloy layer on the metal layer by chemical vapor deposition or by atomic layer deposition and may include: a load/unload chamber, first and second deposition chambers connected to the load/unload chamber by respective ports; a mechanism for transferring a substrate between the first deposition chamber, the second deposition chamber and the load/unload chamber; wherein the first deposition chamber configured to selectively form a metal layer on copper by chemical vapor deposition or by atomic layer deposition; and wherein the second deposition chamber is configured to form a dielectric layer by chemical vapor deposition; the first and second deposition chambers may be re configured for chemical vapor deposition or (ii) the first deposition chamber is configured for atomic layer deposition and the second deposition chamber is configured for chemical vapor deposition; the first chambers may also be configured to form a metal alloy layer on the metal layer by either selective chemical vapor deposition or selective atomic layer deposition; the deposition tool may include a third deposition chamber configured to selectively form a metal alloy on a metal; and wherein (i) the first, second and third deposition chambers are configured for chemical vapor deposition or (ii) the first and third deposition chamber are configured for chemical vapor deposition and the second chamber is configured for atomic layer deposition, or (iii) the second and third deposition chambers are configured chemical vapor deposition and the first chamber is configured for atomic layer deposition, or (iv) the first and second deposition chambers are configured for atomic layer deposition and the third deposition chamber is configured for chemical vapor deposition.

An aspect of the invention comprise a process comprising: (a) forming a wire embedded in a dielectric layer on a semiconductor substrate, the wire comprising a copper core comprising sidewalls and a bottom of the copper core, a top surface of the wire coplanar with a top surface of the dielectric layer; (b) forming an electrically conductive liner on the top surface based on an alloy of, or intercalated combinations of Mn, with at least one of Co and/or W to minimize or eliminate EM and/or TDDB; (c) without exposing the substrate to oxygen, forming a dielectric liner over the liner, any exposed portions of the liner, and the dielectric layer. This process may include steps wherein: (b) and (c) are performed in a same chamber of a first deposition tool without removing the substrate from the chamber; or (b) and (c) are performed in a different chamber or chambers of a second deposition tool without removing the substrate from the tool. This process may also include forming the liner by either selective chemical vapor deposition or selective atomic layer deposition, as well as one wherein the liner comprise an alloy of, or intercalated combinations of Mn of from about 0.1 to about 20 parts by weight, Co of from about 0 to about 100 parts by weight, and W of from about 0 to about 100 parts by weight. The liner also may comprise an ultra thin metal liner from about 0.3 nm to about 1 nm thick. The process may further comprise performing steps (a), (b) and (c) in a same chamber of a first deposition tool without removing the substrate from the chamber; or (a) and (b) in a first chamber and (c) in a third chamber of a second deposition tool; or (a), (b) and (c) in different chambers of a third deposition tool. Another aspect of the process comprises including a procedure between (a) and (b) of recessing a top surface of the copper core below the top surface of the dielectric layer. The invention also comprises another embodiment of conducting the process in an integrated in-situ apparatus having from about 3 to about 5 chambers including a lower chamber and conducting the deposition by means of the apparatus to deposit at least one of multilayer metals (intercalated combinations), or metal alloys or dielectrics and optionally performing a cure treatment in the lower chamber or the steps of further downstream treatments selected from at least one of UV and Low rf stream plasma or thermal cure treatments in at least one of a reducing environment or inert gas ambient to enhance the reaction/intermixing between each layer and between the Cu-Metal alloy or intercalated Cu-Metal combination interface formed in the process.

Throughout this specification, and abstract of the disclosure, the inventors have set out equivalents, of various materials as well as combinations of elements, materials, compounds, compositions, conditions, processes, structures and the like, and even though set out individually, also include combinations of these equivalents such as the two component, three component, or four component combinations, or more as well as combinations of such equivalent elements, materials, compositions conditions, processes, structures and the like in any ratios or in any manner.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" as applied to any claim or any parameters herein, such as a numerical value, including values used to describe numerical ranges, means slight variations in the parameter or the meaning ordinarily ascribed to these terms by a person with ordinary skill in the art. In another embodiment, the terms "about," "substantial," or "substantially," when employed to define numerical parameter include, e.g., a variation up to five per-cent, ten per-cent, or 15 per-cent, or somewhat higher. Applicants intend that terms used in the as-filed or amended written description and claims of this application that are in the plural or singular shall also be construed to include both the singular and plural respectively when construing the scope of the present invention.

All scientific journal articles and other articles, including internet sites, as well as issued and pending patents that this written description or applicants' Invention Disclosure Statements mention, including the references cited in such scientific journal articles and other articles, including internet sites, and such patents, are incorporated herein by reference in their entirety and for the purpose cited in this written description and for all other disclosures contained in such scientific journal articles and other articles, including internet sites as well as patents and the references cited therein, as all or any one may bear on or apply in whole or in part, not only to the foregoing written description, but also the following claims, and abstract of the disclosure.

Although we describe the invention by reference to some embodiments, other embodiments defined by the doctrine of equivalents are intended to be included as falling within the broad scope and spirit of the foregoing written description, and the following claims, abstract of the disclosure, and drawings.

We claim:

1. A process of forming a wiring layer over a semiconductor substrate, comprising:
    forming one or more trenches within a dielectric layer over the semiconductor substrate;
    forming a metal alloy liner within the one or more trenches and adjoining the dielectric layer, the metal alloy liner having a thickness between about 0.1 nm to about 3.0 nm and comprising Co/Mn/W, W/Mn or W/Mn/Co;

forming a copper wire layer within the one or more trenches and over the metal alloy liner to obtain a wire embedded in the dielectric layer on the semiconductor substrate.

2. The process of claim 1, further including:
forming a metal alloy cap on the copper wire layer, the metal alloy cap comprising Co/Mn/W, W/Mn, or W/Mn/Co.

3. The process of claim 2, further including forming a copper seed layer on the metal alloy liner, the copper wire layer being formed on the copper seed layer.

4. The process of claim 3, wherein the dielectric layer comprises an interlevel dielectric layer comprising low-k dielectric material.

5. The process of claim 4, further including:
forming a dielectric cap over the metal alloy cap.

6. The process of claim 4, wherein forming the metal alloy liner includes:
forming a first metal alloy liner layer directly on the interlevel dielectric layer; and
forming a second metal alloy liner layer directly on the first metal alloy liner layer.

7. The process of claim 6, further including planarizing the copper wire layer down to a top surface of the interlevel dielectric layer.

8. The process of claim 7, wherein forming the metal alloy cap is conducted in a non-oxygen atmosphere.

9. The process of claim 8, wherein forming the metal alloy cap includes:
introducing a manganese hexacarbonyl precursor or manganese amidinate into a chemical vapor deposition reactor; and
introducing a tungsten hexacarbonyl precursor or tungsten amidinate into the chemical vapor deposition reactor.

10. The process of claim 7, wherein forming the metal alloy liner includes:
introducing a manganese hexacarbonyl precursor or manganese amidinate into a chemical vapor deposition reactor; and
introducing a tungsten hexacarbonyl precursor or tungsten amidinate into the chemical vapor deposition reactor.

11. The process of claim 10, wherein forming the metal alloy liner further includes introducing a cobalt precursor into the chemical vapor deposition reactor.

12. The process of claim 10, further including recessing the copper wire layer within the one or more trenches below a top surface of the interlevel dielectric layer prior to forming the metal alloy cap.

13. The process of claim 10, wherein the metal alloy liner comprises Co/Mn/W or W/Mn/Co.

14. The process of claim 10, wherein the metal alloy liner comprises W/Mn.

15. The process of claim 1, wherein the metal alloy liner comprises Co/Mn/W or W/Mn/Co.

16. The process of claim 15, wherein forming the metal alloy liner includes:
introducing a manganese hexacarbonyl precursor or manganese amidinate into a chemical vapor deposition reactor;
introducing a tungsten hexacarbonyl precursor or tungsten amidinate into the chemical vapor deposition reactor; and
introducing a cobalt precursor into the chemical vapor deposition reactor.

* * * * *